(12) United States Patent
Courant (10) Patent No.: US 7,890,895 B2
(45) Date of Patent: Feb. 15, 2011

(54) DETERMINATION OF VALUES OF PHYSICAL PARAMETERS OF ONE OR SEVERAL COMPONENTS OF AN ELECTRONIC CIRCUIT OR OF A MICROELECTRO-MECHANICAL SYSTEM

(75) Inventor: Yoann Courant, Grenoble (FR)

(73) Assignee: Infiniscale, Montbonnot-Saint Martin (FR)

( * ) Notice: Subject to any disclaimer, the term of this patent is extended or adjusted under 35 U.S.C. 154(b) by 230 days.

(21) Appl. No.: 12/267,484

(22) Filed: Nov. 7, 2008

(65) Prior Publication Data

US 2009/0144672 A1 Jun. 4, 2009

(30) Foreign Application Priority Data

Nov. 7, 2007 (FR) .................................. 07 58835

(51) Int. Cl.
*G06F 17/50* (2006.01)
(52) U.S. Cl. .................................. 716/2; 716/8; 706/20
(58) Field of Classification Search ...................... 716/2, 716/8; 706/20
See application file for complete search history.

(56) References Cited

U.S. PATENT DOCUMENTS

| 4,805,225 | A * | 2/1989 | Clark ........................ 382/161 |
| 6,925,618 | B1 * | 8/2005 | Teig et al. ...................... 716/5 |
| 7,277,795 | B2 * | 10/2007 | Boitnott ......................... 702/6 |
| 2009/0240641 | A1 * | 9/2009 | Hashimoto ................... 706/20 |

OTHER PUBLICATIONS

Mukherjee, T. et al: "Optimization-based synthesis of microresonators". Sensors and Actuators A, Elsevier Sequoia; S .A , Lausanne, CH ,vol. 70, No. 1-2,Oct. 1, 1998; pp. 118-127.
Malik, Z. et al: "Informative experimental design for electronic circuits" Quality and Reliability Engineering International Wiley UK , vol. 14, No. 3, May 1998, pp. 177-186.
Del Mar Hershenson, M. et al: "Optimization of Inductor Circuits via Geometric Programming"; Design Automation, 1999. 36th Annual Conference on New Orleans, LA, USA Jun. 21-25, 1999, Piscataway, NJ, USA, IEEE, pp. 994-998.
Goupy, Jacques: "Les plans y experiences"; Revue Modulad, vol. 34, Jul. 2006, pp. 74-116. Partial Translation of Drawings Attached.
Chantarat, N. et al: "Optimal experimental design for systems involving both quantitative and qualitative factors"; Jan. 1, 2003, vol. CONF 36, pp. 556-564 vol. 1.
French Search Report dated Aug. 13, 2008.

* cited by examiner

*Primary Examiner*—Naum B Levin
(74) *Attorney, Agent, or Firm*—Howard IP Law Group, PC (57) ABSTRACT

A method for determining, for each of at least p physical parameters of one or several components of an electronic circuit or of a microelectromechanical system, a number n of experiment values of the physical parameter includes determining n vectors of dimension p, each component of each of the vectors corresponding to one of n initial values of one of physical parameters; and iteratively modifying at least some of the n vectors to bring to a maximum, at least locally, for each pair of vectors from among pairs of n vectors, the smallest average of the sum of distances between the vectors of said pair projected onto sub-spaces of dimension k, where k belongs to a set of integers ranging between 1 and p and at least comprising 1, 2, and p, the components of each of the n vectors corresponding, at the end of the iterations, to experiment values.

16 Claims, 3 Drawing Sheets

DETERMINATION OF VALUES OF PHYSICAL PARAMETERS OF ONE OR SEVERAL COMPONENTS OF AN ELECTRONIC CIRCUIT OR OF A MICROELECTRO-MECHANICAL SYSTEM

RELATED APPLICATIONS

This application claims the benefit of French application Ser. No. 07/58835, filed Nov. 7, 2007, the entire disclosure of which is incorporated herein by reference in its entirety.

FIELD OF THE INVENTION

The present invention relates to the determination of values of physical parameters of one or several components of an electronic circuit or of a microelectromechanical system.

BACKGROUND OF THE INVENTION

For design of an electronic circuit or of a microelectromechanical system (MEMS), many physical parameters of constitutive components must be taken into account. In the case of an electronic circuit including several components, the physical parameters may correspond to the features of its constitutive transistors, resistors, and inductors, for example. In the case of a single electronic component such as an inductor, the physical parameters may correspond to the size of the inductor, to the properties of the material used to form the inductor, and to the properties of the materials close to the inductor, for example. For a microelectromechanical system, by way of example only, the physical parameters may correspond to the system dimensions and to the mechanical properties of the elements.

It is generally desirable to know the variation of physical properties which are characteristic of the electronic circuit or microelectromechanical system operation according to the physical parameters thereof. As an example, for an electronic circuit having several components, a physical property may be the consumption or the phase margin. For a single electronic component such as an inductor, a physical property may be the inductance value of the component or the quality factor. For a microelectromechanical system, a physical property may be the resonance frequency, or the cut-off frequency, or the sensitivity.

Determining the variation of a physical property according to physical parameters may be difficult. Indeed, it may be virtually impossible to determine a precise physical model of the operation of an electronic circuit or of a given microelectromechanical system based on equations of physics. Indeed, satisfactory physical models may not exist for certain ongoing physical phenomena, especially at very small scales. In this case, to know the variation of a physical property according to physical parameters, many tests would have to be carried out over all the variation ranges of the physical parameters. For reasons of time and cost, it is generally desirable to decrease the number of tests to a minimum. Only a few values of the physical property are then determined, which is insufficient to determine the full evolution of the physical property.

Even when physical models are available, the complexity of these models, especially due to the large number of physical parameters to be taken into account, makes it impossible to perform simulations over all the variations ranges of the physical parameters for reasons of time and cost, and only allows performing simulations for a few values of the physical property. Here again, this is insufficient to determine the full extent of the physical property.

To determine the extent of the physical property over all the variation ranges of the physical parameter, models are used, which are not obtained from physical equations but which only attempt to reproduce, as much as possible, the few available values of the physical property obtained by tests or simulations. Such models are said to be behavioral. They are generally simpler to implement and enable processes to simulate more easily the variation of the physical property over all the physical parameter variation ranges. An example of a behavioral model may correspond to a polynomial model.

Determining a behavioral model thus requires having values of the physical parameters and corresponding values of the physical property obtained by tests or simulations. Specific values of the physical parameters for which the corresponding value of the physical property is obtained by test or by simulation are generally called experiments or experiment points. The experiments altogether form what is called the experimental design.

A technical problem is to determine which experiments must be done to determine the behavioral model. Finding a solution to this technical problem is difficult, knowing that it is desirable for the number of experiments to be as small as possible to decrease the number of tests or simulations to be performed, and to have experiments which are as "representative" of the behavior of the electronic circuit or of the microelectromechanical system to better determine the behavioral model.

In the case of a behavioral model of polynomial type, there exist techniques for systematically determining, according to the selected polynomial model type, the optimum experimental design according to a given optimality criterion (D-optimality, G-optimality, etc.). An example of such a technique is described in the work entitled "La méthode des plans d'expérience—Optimisation du choix des essais & de l'interprétation des résultats" by J. Goupy, Editions Dunod, 1996. However, when the number of physical parameters is large, these techniques require determining a large number of experiments. It is then necessary to simplify the polynomial model or to limit the research to smaller variation ranges of the physical parameters to decrease the number of experiments.

SUMMARY OF THE INVENTION

An aspect of the present invention aims at a method and a device for determining specific values of physical parameters of one or several components of an electronic circuit or of a microelectromechanical system for determination of a behavioral model of the electronic circuit or of the microelectromechanical system which enables determining an arbitrary number of the values.

According to another aspect, the determination of the specific values may be implemented independently from the previous knowledge of the selected behavioral model.

Thus, an embodiment of the present invention provides a method for determining, for each of at least p physical parameters of one or several components of an electronic circuit or of a microelectromechanical system, a number n of experiment values of the physical parameter. The method includes the steps of determining n vectors of dimension p, each component of each of the vectors corresponding to one of n initial values of one of the physical parameters; and iteratively modifying at least some of the n vectors to bring to a maximum, at least locally, for each pair of vectors from among pairs of the n vectors, the smallest average of the sum of distances between the vectors of the pair projected onto subspaces of dimension k, where k belongs to a set of integers ranging between 1 and p and at least comprising 1, 2, and p, the components of each of the n vectors corresponding, at the end of the iterations, to the experiment values.

The present invention also provides a method for determining a number n of first values of at least one physical property of one or several components of an electronic circuit or of a microelectromechanical system. The method includes the steps of determining, for each of at least p physical parameters of the component or of the several components of the electronic circuit or of the microelectromechanical system, n second values according to the previously defined method; and measuring, for each second value of the p physical parameters, the first corresponding value of the physical property.

According to an embodiment, among the n vectors, at least n0 vectors are predetermined, n0 being an integer greater than or equal to zero.

According to an embodiment, the n vectors which bring to a maximum, at least locally, the smallest average, are determined by a greedy algorithm.

According to an embodiment, the smallest average is defined by the following relation:

$$S(X^1, X^2, \ldots, X^n) = \min_{\substack{i \in \{1 \ldots n\} \\ j \in \{n_0+1 \ldots n\}, i \neq j}} d(X^i, X^j)$$

where:
X1, X2, . . . , Xn are the n vectors;
i and j are distinct integers;
n0 corresponds to a number, possibly zero, smaller than n, of predetermined vectors; and
d(Xi, Xj) is a distance defined by the following relation:

$$d(X^i, X^j) = \operatorname*{av}_{k \in E}(d_k(X^i, X^j))$$

where:
E is a set of integers ranging between 1 and p and comprising at least 1, 2, and p;
av is the average operator; and $$d_k(X^i, X^j) = \operatorname*{av}_{\substack{r_1, r_2, \ldots, r_k \in \{1 \ldots p\} \\ r_1 < r_2 < \ldots < r_k}} \left( \sqrt{\frac{(X^i_{r_1} - X^j_{r_1})^2 + (X^i_{r_2} - X^j_{r_2})^2 + \ldots + (X^i_{r_k} - X^j_{r_k})^2}{k}} \right)$$

According to an embodiment, the physical property is modeled from the physical parameters by a modelization function. The smallest average is decreased by a coefficient proportional to the maximum, for at least some of the n vectors, of reliability indexes, each reliability index being representative of the reliability of the modelization function for one of the at least some of the n vectors.

According to an embodiment, several physical properties are measured for each value of said vector. The physical properties are capable of being modeled based on the physical parameters by several modelization functions. The smallest average is decreased by a coefficient proportional to the maximum, for at least some of the n vectors and for the modelization functions, of the minimum values, for the physical properties, of reliability indexes, each reliability index being representative of the reliability of one of the modelization functions for one of the physical properties and for one of the at least some of the n vectors.

According to an embodiment, with each parameter are associated a variation range and a probability distribution. The step of determining the n vectors includes the steps of determining initial vectors by random selections of the initial values of each physical parameter over the associated variation range by using the associated probability distribution; and repeating, until a stop condition is fulfilled, the steps of determining a candidate vector by random selections of a candidate value of each physical parameter over the associated variation range by using the associated probability distribution; successively replacing with the candidate vector at least one vector from among some of the n vectors and determining, for each replacement, said corresponding smallest average; if the smallest average which is maximum among the determined smallest averages is greater than the smallest average determined for the n vectors, replacing with the candidate vector the vector or one of the vectors for which the associated smallest average corresponds to the maximum smallest average when the vector is replaced with the candidate vector.

The present invention also provides a system for determining for each of at least p physical parameters of one or several components of an electronic circuit or of a microelectromechanical system, a number n of experiment values, including an entry interface capable of receiving number n and a digital central processing unit capable of implementing the previously defined method.

DETAILED DESCRIPTION

For clarity, the same elements have been designated with the same reference numerals in the different drawings.

The present invention provides determining the experiment points which enable to optimize a determined optimality criterion.

The component(s) of an electronic circuit or of a microelectromechanical system, having an operation described by a number p of physical parameters, is (are) considered. Number p corresponds to the dimensions of study field D which is defined by the variation range of the physical parameters. It should be noted that there may exist relations of dependence between certain physical parameters. Call parameter vector X the vector of dimension p having each of its components corresponding to one of the physical parameters of one or several components of the studied electronic circuit or microelectromechanical system. Call Xr the component of index r of parameter vector X, that is, the parameter of index r. An experiment point thus corresponds to a specific value of parameter vector X. The values of the components of parameter vector X are normalized. By way of example, each component of parameter vector X corresponds to a real value of the corresponding parameter centered and reduced by reference values, for example, by centering the real value around the expected average value of the parameter and by dividing by the expected variance.

Figure 1:
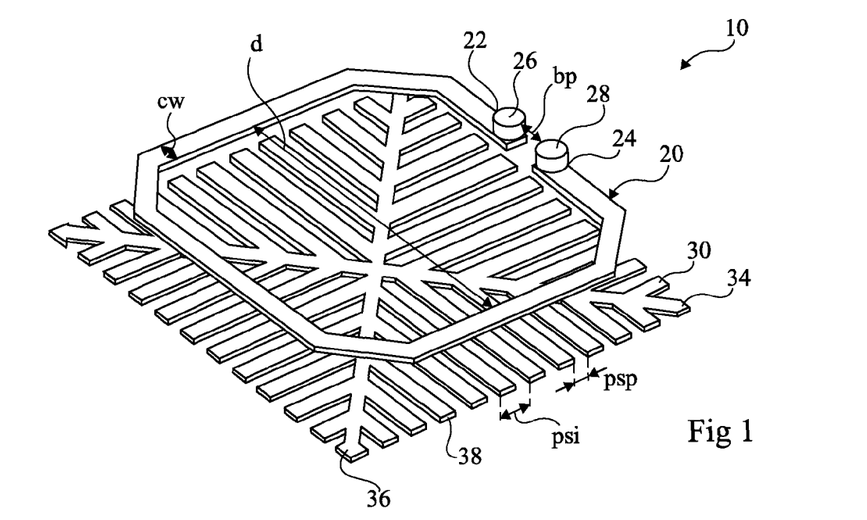
FIGS. 1 and 2 respectively are a perspective view and a cross-section view of an inductor structure for which specific values of physical parameters are determined in accordance with the principles of the present invention.
Figure 2:
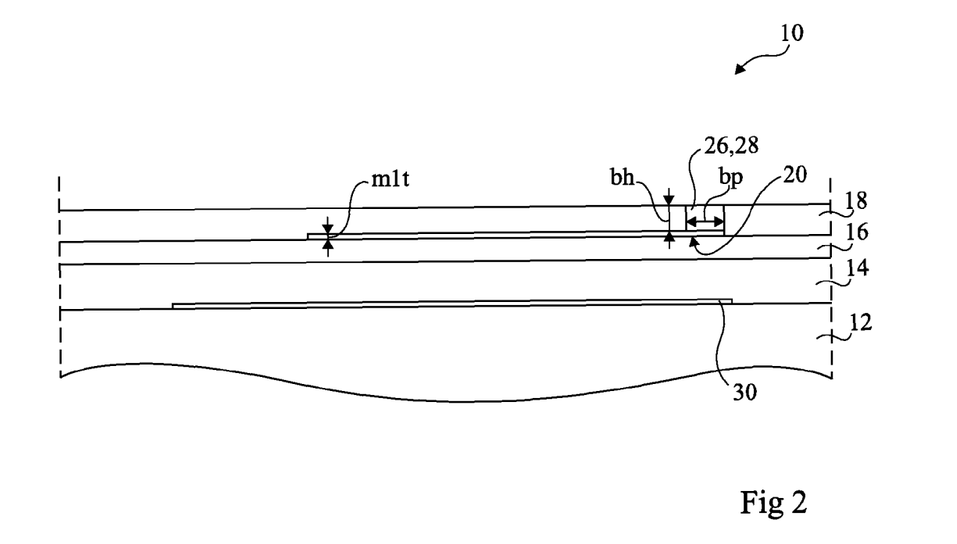

FIGS. 1 and 2 illustrate an example of physical parameters of a single electronic component. FIGS. 1 and 2 respectively show a simplified perspective view and a cross-section view of an inductor structure 10 made in integrated form at the level of a silicon substrate 12 covered with a stacking of insulating layers 14, 16, 18, with polysilicon tracks covering substrate 12 and metal tracks of different metallization levels being provided in the stacking of insulating layers 14, 16, 18.

Inductor structure 10 includes a loop 20 formed in one of the metallization levels and having two ends 22 and 24. Each end 22, 24 is connected to a cylindrical via 26, 28 provided in insulating layer 18. A lower protection plane 30 formed by polysilicon tracks is arranged under loop 20. Protection plane 30 is formed of two cross-shaped tracks 34, 36 from which groups of parallel fingers 38 extend. An upper protection plane, not shown, may be provided above loop 20.

Examples of physical parameters of inductor structure 10 are the following:

d: diameter of loop 20;
bp: interval between vias 26 and 28;
cw: width of loop 20;
mlt: thickness of loop 20;
bp: diameter of via 26, 28;
bh: height of via 26, 28;
psp: interval between two adjacent fingers 38; and
psi: pitch of fingers 38.

The foregoing are physical parameters relative to the shape of inductor structure 10 and relative to technological constraints.

The inductance value and the quality factor of inductor structure 10 are examples of physical properties of inductor structure 10 having variations according to the previously described physical parameters which may be desired to be known.

An example of physical parameters of an electronic circuit including several components will now be described for a voltage regulator. A circuit having several voltage and current sources, of several tens of resistances, capacitors, diodes, and MOS transistors (N-channel and P-channel) is considered as an example.

Examples of physical parameters of the voltage regulator are the following:

circuit charge current;
stray capacitances;
parasitic resistances;
widths of polysilicon tracks;
resistance of the metal used to form the metal tracks;
gate resistance of the N-type MOS transistors;
contact resistance of the N-type MOS transistors;
gate resistance of the P-type MOS transistors;
capacitance of the active silicon regions;
parasitic diodes of the N-type transistors;
parasitic diodes of the P-type transistors; and
resistance of the polysilicon.

The consumption, the phase margin, the frequency at unity gain, the phase margin at 0.1 MHz and the phase margin at 1 MHz are examples of physical properties having variations according to the previously-described physical parameters which are to be determined.

Figure 3:
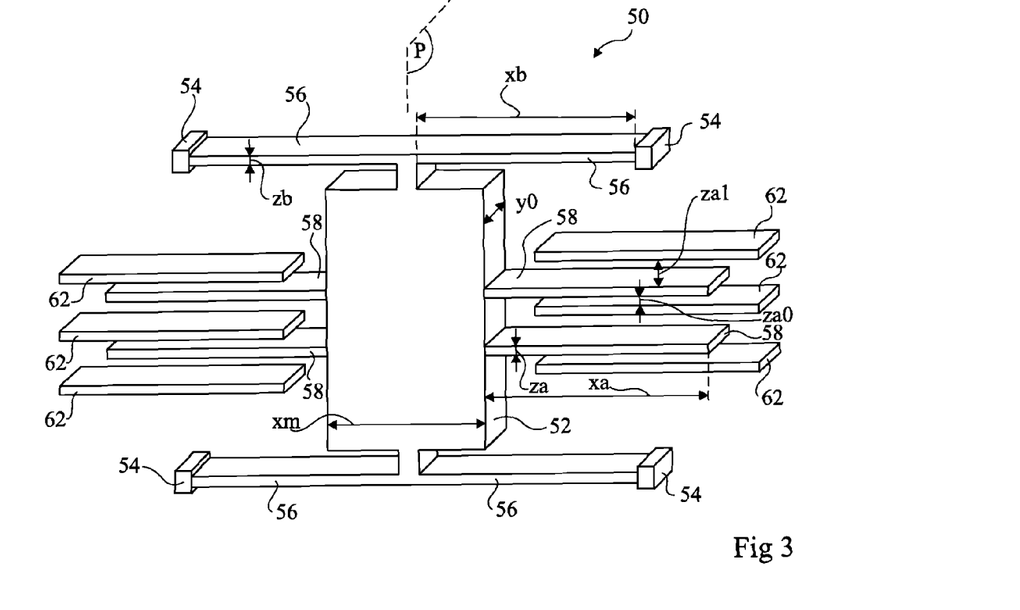
FIG. 3 is a perspective view of an accelerometer for which specific values of physical parameters are determined in accordance with the principles of the present invention.

FIG. 3 illustrates an example of physical parameters of a microelectromechanical system or MEMS, and shows a simplified perspective view of an accelerometer 50 formed at the level of a substrate of silicon-on-insulator or SOI type. Accelerometer 50 includes a body 52 connected to four fixed pads 54 by four flexure beams 56. In the present example, body 52 is symmetrical with respect to a plane P. Accelerometer 50 further includes a total number nba of mobile electrodes 58 projecting from body 52. As an example, four mobile electrodes 58, having the shape of parallel arms, projecting in two groups of two mobile electrodes 58 on each side of body 52 have been shown in FIG. 3. Accelerometer 50 further includes a total number nba+2 of fixed electrodes 62, distributed in two groups on either side of body 52, mobile electrodes 58 being interposed between fixed electrodes 62.

Examples of physical parameters of accelerometer 50 are the following:

xa: length of a mobile electrode 58;
xb: length of a beam 56;
xm: width of body 52;
za: width of a mobile electrode 58;
zb: width of a beam 56;
za0: small interval between one of mobile electrodes 58 and one of the adjacent fixed electrodes 62;
za1: large interval between one of mobile electrodes 58 and the other one of the adjacent fixed electrodes 62;
y0: thickness of the upper semiconductor layer of the SOI substrate;
nba: number of mobile electrodes 58; and
dc: minimum capacitance variation detectable by a circuit used to measure the capacitance between mobile electrodes 58 and fixed electrodes 62 of accelerometer 50.

In this specific example, to define the variation range of the physical parameters, it is further imposed for za1 to be strictly greater than za0, for xa to be strictly greater than za, and for xb to be strictly greater than zb.

The other parameters, not disclosed hereabove, used to describe the physics of accelerometer 50, such as, for example, the pressure of the gas in which body 52 of accelerometer 50 is immersed or the length of the portion of a mobile electrode 58 which is not in front of a fixed electrode 62, are set.

The mechanical resonance frequency of accelerometer 50, the mechanical cut-off frequency of accelerometer 50, the rated capacitance of accelerometer 50, the sensitivity of accelerometer 50, the resolution of accelerometer 50 (that is, the minimum detectable acceleration variation), and the maximum range of accelerometer 50 in open loop are examples of physical properties of accelerometer 50 having variations according to the previously-described physical parameters which are to be determined.

An embodiment of the method for determining the experiment points will now be described. The present example of a method for determining experiment points can be implemented by a computer. By way of example, the method may be embodied in one or more hardware/software and/or firmware modules in a memory and that cooperate with a processor such as a digital central processing unit or CPU. The digital central processing unit is coupled to an entry interface which is capable of receiving input data (e.g., from a user or other peripheral device) for determining values of the physical parameters associated with the component(s) under test. Still further, it is understood by those skilled in the art of computer programming that the invention may be implemented in a system of computer units, optionally being communicatively coupled to one another over a network, such as a wide area network, local area network or the global interconnection of computers and computer networks commonly referred to as the Internet. Such a network may typically include one or more microprocessor based computing devices, such as a personal computer (PC) as well as server computers (servers). "Personal computer", as referred to herein, refers to a general purpose computing device that includes a processor. "Processor", as used herein, refers generally to a computing device including a Central Processing Unit (CPU), such as a microprocessor. A CPU generally includes an arithmetic logic unit (ALU), which performs arithmetic and logical operations, and a control unit, which extracts instructions (e.g., code) from memory and decodes and executes them, calling on the ALU when necessary. "Memory", as used herein, refers to one or more devices capable of storing data, such as in the form of chips, tapes, disks or drives. Memory may take the form of one or more random-access memory (RAM), read-only memory (ROM), programmable read-only memory (PROM), erasable programmable read-only memory (EPROM), or electrically erasable programmable read-only memory (EEPROM) chips, by way of further non-limiting example only. Memory may be internal or external to an integrated unit including a processor. Memory may be internal or external to an integrated unit including a processor. Memory preferably stores a computer program, e.g., code or sequence of instructions being operable by a processor.

By way of further non-limiting example, in a distributed implementation, the system may typically include a local area network (LAN) of terminals or workstations (e.g., PCs), data interfaces, database file servers, input devices and output devices configured by software for accumulating, processing, administering and analyzing attributes in an automated workflow environment. "Server", as used herein, generally refers to a computer or device communicatively coupled to a network that manages network resources. For example, a file server is a computer and storage device dedicated to storing files, while a database server is a computer system that processes database queries. A server may refer to a discrete computing device, or may refer to the program that is managing resources rather than an entire computer.

By way of further, non-limiting example, a system implementing the present invention may include a computer having a CPU with an arithmetic logic unit (ALU) for making mathematical calculations, and associated memory registers, program controls, input output circuitry; a memory and one or more file storage mediums internal or external to the computer for storing data. Interfaces connecting the computer and external accessories, such as a display monitor, keyboard, pointing device and/or a printer, may also be provided. The processor both controls, and is controlled by, other hardware, as well as software stored in memory and/or on a portion of a storage medium. Processor-executable code may be stored in said storage medium and/or memory and may embody the methods of the present invention, such that execution thereof causes the computer to carry out the processes described and depicted herein, for example. A computer, such as that described herein, may be programmed to carry out the processes shown in and discussed with regard to FIGS. 4-5 hereof.

In accordance with an aspect of the present invention, call n the number of experiment points which are targeted to be used to determine the behavioral model of the electronic circuit or of the microelectromechanical system. The experiment points are noted X1, X2, . . . Xn. Call S the used optimality criterion. The experiment points X1, X2, . . . Xn for which optimality criterion S is maximum are thus searched for in research field D by the digital central processing unit.

In the case where there are no already-known experiment points, n experiment points will have to be determined. The computer-implemented method for maximizing optimality criterion S may be written as:

$$\max_{X^1, X^2, \ldots, X^n \in D} S(X^1, X^2, \ldots, X^n) \quad (1)$$

In the case where n0 experiment points have already been previously determined, n0 being smaller than n, these experiment points are kept by the digital central processing unit. There then remain n−n0 experiment points to be determined by the digital central processing unit, which points are noted Xn0+1, Xn0+2 to Xn. The computer-implemented method for maximizing optimality criterion S may then be written as:

$$\max_{X^{n_0+1}, X^{n_0+2}, \ldots, X^n \in D} S(X^1, X^2, \ldots, X^n) \quad (2)$$

It should be noted that, although n0 experiment points have already been determined, optimality criterion S takes into account all n experiment points. In the following description, it is considered that n0 experiment points have already been determined. In the case where no experiment point has been previously determined, it is sufficient to replace n0 with zero in the expressions which will be mentioned hereafter.

According to a computer-implemented embodiment, consider each pair of experiment points as including a first experiment point among the experiment points to be determined $X^{n_0+1}, \ldots, X^n$ and a second experiment point, among all the experiment points X1, X2, . . . , Xn and consider, for each pair, a mathematical distance between the first and second experiment points of the pair, then optimality criterion S corresponds to the smallest of the obtained distances.

Optimality criterion S corresponds then to the smallest mathematical distance between an experiment point to be determined and another experiment point, among all experiment points X1, X2, . . . Xn, and is given by the following relation:

$$S(X^1, X^2, \ldots, X^n) = \min_{\substack{i \in \{1 \ldots n\} \\ j \in \{n_0+1 \ldots n\}, i \neq j}} d(X^i, X^j) \quad (3)$$

where d is the considered distance.

Such an optimality criterion tends to make the determined experiment points distant from one another and from the preexisting ones, while remaining within the specified study field, that is, it tends to make the sets of determined physical parameter values as little similar as possible. "Similar" refers to distance d(Z,Y) between two experiment points Z and Y, defined hereafter, which takes into account the features of the determined experiment points projected onto the different sub-spaces of the possible parameters of dimension k, where k is an integer ranging between 1 and p.

An example of a distance d between two experiment points Z and Y of dimension p is given by the following relation:

$$d(Z, Y) = \operatorname*{av}_{k \in \{1 \ldots p\}}(d_k(Z, Y)) = \frac{1}{p}\sum_{k=1}^{p} d_k(Z, Y) \quad (4)$$

where dk is an average distance over the sub-spaces of parameters of dimension k. Distances dk, for k varying from 1 to p, are provided by the following relations:

$$d_1(Z, Y) = \underset{r_1 \in \{1...p\}}{av}(|Z_{r_1} - Y_{r_1}|) = \frac{1}{p} \sum_{r_1 \in \{1...p\}} |Z_{r_1} - Y_{r_1}| \quad (5)$$

$$d_2(Z, Y) = \underset{\substack{r_1,r_2 \in \{1...p\} \\ r_1 < r_2}}{av}\left(\sqrt{\frac{(Z_{r_1} - Y_{r_1})^2 + (Z_{r_2} - Y_{r_2})^2}{2}}\right) \quad (6)$$

$$d_2(Z, Y) = \frac{1}{C_p^2} \sum_{\substack{r_1,r_2 \in \{1...p\} \\ r_1 < r_2}} \sqrt{\frac{(Z_{r_1} - Y_{r_1})^2 + (Z_{r_2} - Y_{r_2})^2}{2}} \quad (7)$$

$$\vdots$$

$$d_k(Z, Y) = \underset{\substack{r_1,r_2,...,r_k \in \{1...p\} \\ r_1 < r_2 < ... < r_k}}{av}\left(\sqrt{\frac{(Z_{r_1} - Y_{r_1})^2 + (Z_{r_2} - Y_{r_2})^2 + ... + (Z_{r_k} - Y_{r_k})^2}{k}}\right) \quad (8)$$

$$d_k(Z, Y) = \frac{1}{C_p^k} \sum_{\substack{r_1,r_2,...,r_k \in \{1...p\} \\ r_1 < r_2 < ... < r_k}} \sqrt{\frac{(Z_{r_1} - Y_{r_1})^2 + (Z_{r_2} - Y_{r_2})^2 + ... + (Z_{r_k} - Y_{r_k})^2}{k}} \quad (9)$$

$$\vdots$$

$$d_p(Z, Y) = \left(\sqrt{\frac{(Z_{r_1} - Y_{r_1})^2 + (Z_{r_2} - Y_{r_2})^2 + ... + (Z_{r_p} - Y_{r_p})^2}{p}}\right) \quad (10)$$

where $C_p^k$ is the number of combinations without repetition of p elements taken k by k and av is the average operator.

The above-described embodiment advantageously enables not to take into account the behavioral model which will be used afterwards. However, it may be advantageous to take into account the uncertainties linked to this behavioral model. For this purpose, another computer-implemented embodiment provides completing previously defined optimality criterion S to take into account, in the determination of new experiment points, the fact that the behavioral model risks being less accurate in certain regions of the study field.

First consider the case where a single physical property of the electronic circuit or of the microelectromechanical system will be modeled by a behavioral model or modelization function f. Physical property W is then defined by the following relation:

$$W = f(X) \quad (11)$$

Call cf(Xi) the reliability index of behavioral model f for experiment point Xi. The reliability index enables to estimate the reliability of model f at a given experiment point and varies between 0 (unreliable value of the model) and 1 (reliable value of the model).

Optimality criterion S is then provided by the following relation:

$$S(X^1, X^2, ..., X^n) = \underset{\substack{i \in \{1...n\} \\ j \in \{n_0+1...n\}, i \neq j}}{\min} d(X^i, X^j) - \alpha \underset{j \in \{n_0+1...n\}}{\max} (c_f(X^j)) \quad (12)$$

where $\alpha$ is a weighting coefficient enabling privileging the reliability of the modelization over the distance between experiment points. In the case where $\alpha$ is zero, optimality criterion S corresponds to the optimality criterion previously defined by relation (3). If the components of parameter vector X are normalized between 0 and 1 and $\alpha$ is equal to 1/n, a compromise enabling selection of new experiment points sufficiently different from one another as well as from those which are unreliable is obtained.

Now consider the case where several physical properties of the electronic circuit or microelectromechanical system will be modeled and where it can be selected between several behavioral models, each behavioral model providing, based on a value of parameter vector X, the resulting values of the physical properties.

Call f1, f2, ... fq the q modelization functions or behavioral models likely to be used and $c_{f_1}(X^i)$, $c_{f_2}(X^i)$, ..., $c_{f_q}(X^i)$ the reliability indexes respectively associated with behavioral models f1, f2, ... fq at experiment point Xi. Each of functions fk enables to model m physical properties (for example, the inductance value, the quality factor, etc.) according to the p physical parameters. Reliability indexes $c_{f_k}$ are also defined for each function fk, and the reliability index of output r of function fk is called $c_{f_k}^r(X^i)$.

Optimization criterion S is then provided by the following relation:

$$S(X^1, X^2, ..., X^n) = \underset{\substack{i \in \{1...n\} \\ j \in \{n_0+1...n\}, j \neq i}}{\min} (d(X^i, X^j)) - \alpha \underset{\substack{j \in \{n_0+1...n\} \\ k \in \{1...q\}}}{\max}\left(\underset{r \in \{1...m\}}{\min}(c_{f_k}^r(X^j))\right) \quad (13)$$

In relation (13), as compared with relation (12), the criterion is based on the worst of outputs r of a model (the less reliable) to be able to compare models fk with one another and eventually retain the best one.

According to another computer-implemented embodiment, when the number of physical parameters is large, determining distance d(Z,Y) may be costly in terms of calculation time. It is then possible to use an average distance over the sub-spaces of parameters of dimensions 1, 2, and p only. Distance d(Z, Y) then is provided by the following relation:

$$d(Z, Y) = \frac{d_1(Z, Y) + d_2(Z, Y) + d_p(Z, Y)}{3} \quad (14)$$

The maximizing of optimality criterion S, such as provided in relation (1), is performed by a greedy algorithm. The experiment points thus determined by the digital central processing unit thus correspond to a sub-optimal solution of the problem and are obtained by a sequence of partial optimization of the optimality criterion. Implementing the greedy algorithm requires associating with each physical parameter a probability distribution to be able to determine an initial value of the physical parameter and to be able to modify the value of the physical parameter. As an example, for a physical parameter ranging between 0 and 1, an example of probability distribution corresponds to a uniform distribution over [0,1].

A mathematical formulation of the used greedy algorithm is the following:

At times 0, 1, ..., t, and the following, values of parameter vectors X, noted $\{\hat{X}(0), \hat{X}(1), ..., \hat{X}(t), ...\}$, obtained by random selection of values of the physical parameters limited to study field D are determined by using the corresponding probability distributions.

At time t equal to 0, for an integer k ranging between n0+1 and n, a value of parameter vector X, noted Xk(0), is determined by random selection of the physical parameters limited to study field D, by using corresponding probability distributions. An initial optimality criterion $\tilde{S}(0)$ is also determined as follows.

$$\tilde{S}(0)=S(X^1(0),\ldots,X^n(0)) \quad (15)$$

At time t, set $\hat{N}(t)$ which corresponds to the set of experiment points which, when replaced with $\hat{X}(t)$, result in the obtaining of the maximum optimality criterion $\tilde{S}(t+1)$ at time t+1, is defined. Set $\hat{N}(t)$ is provided by the following relation:

$$\hat{N}(t) = \quad (16)$$
$$\left\{ k \in \{n_0+1,\ldots,n\} \,\middle|\, S\left(X^1,\ldots,X^{n_0},X^{n_0+1}(t),\ldots,\underbrace{\hat{X}(t)}_{k\text{-th element}},\ldots,X^n(t)\right) = \tilde{S}(t+1) \right\}$$

Experiment points Xk(t+1) at iteration t+1 are defined by the following recurrence relation:

$$\forall k \in \{n_0+1,\ldots,n\}, X^k(t+1) = \hat{X}(t) \text{ if } k \in \hat{N}(t) \quad (17)$$
and
$$k = \min(\hat{N}(t))$$
$$= X^k(t) \text{ otherwise}$$

It is thus chosen to replace at iteration t+1 no experiment point, or only the experiment point Xk(t+1) having its exponent k belonging to set $\hat{N}(t)$ and which is the smallest. As a variation, instead of taking index k belonging to set $\hat{N}(t)$ and which is the smallest, index k belonging to set $\hat{N}(t)$ may be selected randomly or by any other rule.

Optimality criterion $\tilde{S}(t+1)$ at time t+1 is defined based on optimality criterion $\tilde{S}(t)$ determined at time t by the following recurrence relation:

$$\tilde{S}(t+1)=\max(S(X^1,\ldots,X^{n_0},\hat{X}(t),X^{n_0+2}(t)\ldots,X^n(t)),$$
$$S(X^1,\ldots,X^{n_0},X^{n_0+1}(t),\hat{X}(t)\ldots,X^n(t))\ldots,$$
$$S(X^1,\ldots,X^{n_0},X^{n_0+1}(t),X^{n_0+2}(t),\ldots,\hat{X}(t)),\tilde{S}(t)) \quad (18)$$

Figure 4:
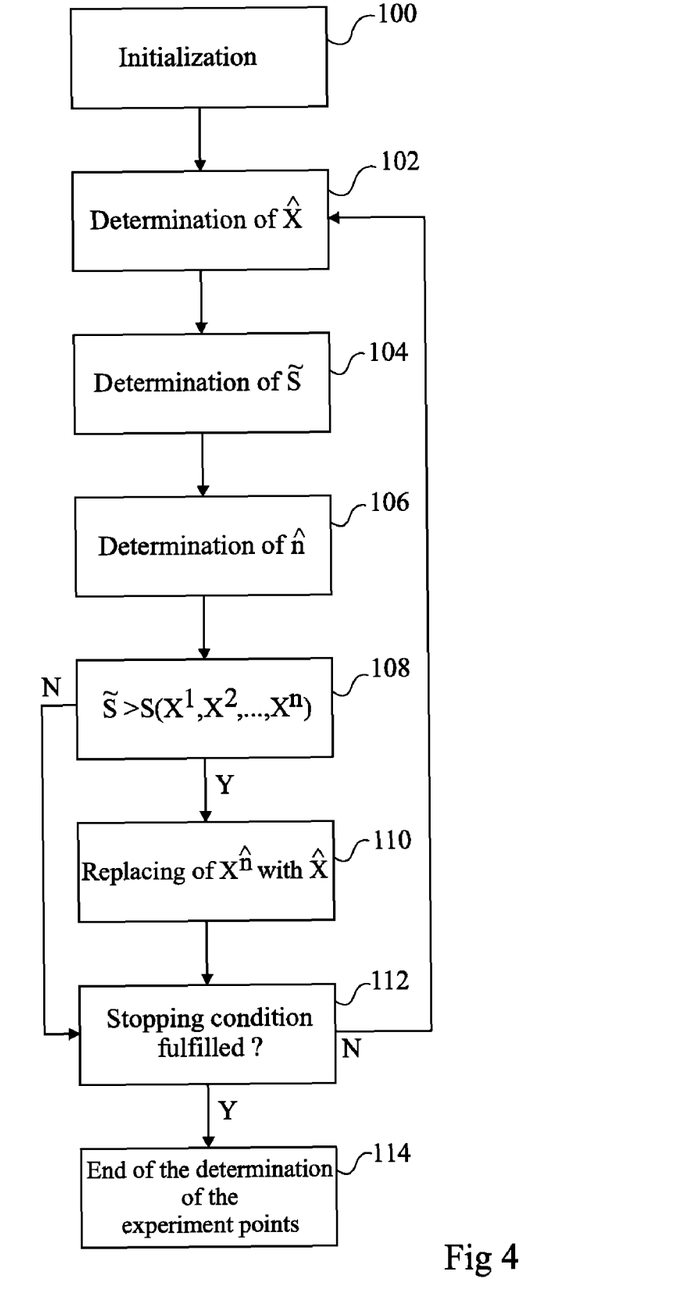
FIG. 4 shows a block-diagram illustrating an example of implementation of the method for determining experiment points according to the present invention.

FIG. 4 shows in the form of a block-diagram an example of a practical implementation of a greedy algorithm. As is known in the art, a digital central processing unit or a processor may be used to implement the greedy algorithm. Further details regarding particular computer or specific implementation are not provided for the sake of brevity.

At step 100, parameter vectors $X^{n_0+1},\ldots,X^n$ are initialized by random selection of the different physical parameters limited to study field D by using the corresponding probability distributions. The method carries on at step 102.

At step 102, a candidate parameter vector $\hat{X}$ is determined by random selection of the different physical parameters limited to research field D by using the corresponding probability distributions. The method carries on at step 104.

At step 104, a new value of optimality criterion $\tilde{S}$ is determined by the following relation:

$$\tilde{S}=\max(S(X^1,\ldots,X^{n_0},\hat{X},X^{n_0+2}\ldots,X^n),S(X^1,\ldots,$$
$$X^{n_0},X^{n_0+1},\hat{X},\ldots,X^n),\ldots,S(X^1,\ldots,X^{n_0},X^{n_0+1},$$
$$X^{n_0+2},\ldots,\hat{X})) \quad (19)$$

The method carries on at step 106.

At step 106, exponent $\hat{n}$, ranging between n0+1 and n, of the experiment point $X^n$ which, when replaced with $\hat{X}$, provides the maximum optimality criterion $\tilde{S}$, is determined. If several exponents n fulfill this condition, the smallest of these exponents may be selected, or it may be selected randomly or by any other rule. The method carries on at step 108.

At step 108, the optimality criterion $\tilde{S}$ determined at the preceding step is compared with $S(X^1, X^2, \ldots, X^n)$. If $\tilde{S}$ is strictly greater than $S(X^1, X^2, \ldots, X^n)$, then the method carries on at step 110. If $\tilde{S}$ is smaller than or equal to $S(X^1, X^2, \ldots, X^n)$, no action is taken and the method carries on at step 112.

At step 110, experiment point $X^n$ is replaced with $\hat{X}$. The method carries on at step 112.

At step 112, it is determined whether the iterative process must be carried on. A criterion to stop the iterative process may be for the number of iterations between steps 102 and 112 to have reached a given limit and/or for an index measuring the stability of the solution to have reached a given threshold. If the stopping condition of the iterative process is fulfilled, the method carries on at step 114. If this stopping condition is not fulfilled, the method carries on at step 102.

At step 114, the process for determining the experiment points is over. Once the experiment points have been determined, measurements of one or of several physical properties of the electronic circuit or of the microelectromechanical system are then performed at the determined experiment points. These measurements may be performed by simulations (e.g., computer simulations) or tests.

Figure 5:
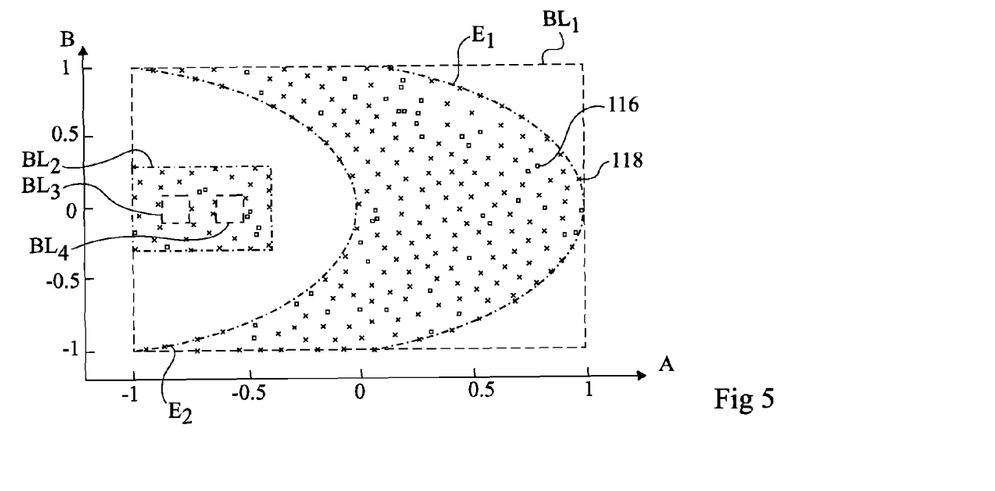
FIG. 5 shows an example of distribution of experiment points obtained by the method according to the present invention.

FIG. 5 shows an example of the distribution of the experiment points obtained by the previously-described method in the case where only two physical parameters A and B are taken into account. Physical parameter A is indicated in abscissas and physical parameter B is indicated in ordinates. For this example, the variation range of parameters A and B is provided by the reunion of first and second surfaces. The first surface corresponds to the intersection of a rectangle (BL1) and of a third surface corresponding to the intersection between the inner surface of a first ellipse (E1) and the outer surface of a second ellipse (E2). The second surface corresponds to a rectangular block (BL2) from which two rectangular sub-blocks (BL3) and (BL4) have been subtracted. The inner surface of the ellipse (E1) is defined by the following relation:

$$\frac{(A-A_1)^2}{R_{1A}^2} + \frac{B^2}{R_{1B}^2} \leq 1 (E_1) \quad (20)$$

The outer surface of ellipse (E2) is defined by the following relation:

$$\frac{(A-A_2)^2}{R_{2A}^2} + \frac{B^2}{R_{2B}^2} > 1 (E_2) \quad (21)$$

with:

$$A_1 = -0.75, R_{1A} = 2.5, R_{1B} = 0.8 \quad (22)$$
$$A_2 = A_1, R_{2A} = 1.5, R_{2B} = 0.56$$

Blocks (BL1), (BL2), (BL3) and (BL4) are defined by the following relations:

$$-1 \leq A \leq 1 \text{ and } -1 \leq B \leq 1 (BL_1) \quad (23)$$

$$-1 \leq A \leq -1+5 \cdot W_A \text{ and } -W_{B1} \leq B \leq W_{B1}(BL_2) \quad (24)$$

$$-1+W_A \leq A \leq -1+2 \cdot W_A \text{ and } -W_{B2} \leq B \leq W_{B2}(BL_3) \quad (25)$$

$$-1+3 \cdot W_A \leq A \leq -1+4 \cdot W_A \text{ and } -W_{B2} \leq B \leq W_{B2}(BL_4) \quad (26)$$

with:

$$W_A=0.12, W_{B1}=0.3, W_{B2}=0.2 \quad (27)$$

Experiment points already determined before the implementation of the method according to the present invention have been represented by squares 116 and the experiment points determined by the implementation of the method according to the present invention have been represented by crosses 118.

The present invention advantageously enables determining an experimental design according to the number of experiments which is desired to be performed by the user. It can be implemented even if the number of physical parameters is large. The physical parameters may have any variation range. Further, the method for determining the experiment points may be implemented independently from the selected behavioral model and independently from the physical properties which are modeled.

The present invention is likely to have various alterations, modifications and improvements which will occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A computer-implemented method for determining, for each of at least p physical parameters of one or several components of an electronic circuit or of a microelectromechanical system, a number n of experiment values of the physical parameter, comprising the steps of:
  in a processor, determining a plurality (n) of vectors of dimension p, each component of each of the plurality of vectors corresponding to one of n initial values of one of said physical parameters;
  in said processor, iteratively modifying at least one of the plurality (n) of vectors to bring to a maximum, at least locally, for each pair of vectors from among pairs of said plurality (n) of vectors, the smallest average of the sum of distances between the vectors of said pair projected onto sub-spaces of dimension k, where k belongs to a set of integers ranging between 1 and p and at least comprising 1, 2, and p, the components of each of the plurality (n) of vectors corresponding, at the end of the iterations; and
  generating, from said processor, an output indicative of said experiment values of the physical parameters for said components.

2. The method of claim 1, wherein among the plurality (n) vectors, at least n0 vectors are predetermined, n0 being an integer greater than or equal to one.

3. The method of claim 1, wherein the plurality (n) of vectors which bring to a maximum, at least locally, said smallest average, are determined according to a greedy algorithm.

4. The method of claim 1, wherein said smallest average is determined according to the relation:

$$S(X^1, X^2, \ldots, X^n) = \min_{\substack{i \in \{1\ldots n\} \\ j \in \{n_0+1\ldots n\}, i \neq j}} d(X^i, X^j)$$

where:
  X1, X2, ..., Xn are the n vectors;
  i and j are distinct integers;
  n0 corresponds to a number, possibly zero, smaller than n, of predetermined vectors; and
  d(Xi, Xj) is a distance defined by the following relation:

$$d(X^i, X^j) = \underset{k \in E}{av}(d_k(X^i, X^j))$$

where:
  E is a set of integers ranging between 1 and p and comprising at least 1, 2, and p;
  av is the average operator; and $$d_k(X^i, X^j) = \underset{\substack{r_1, r_2, \ldots, r_k \in \{1\ldots p\} \\ r_1 < r_2 < \ldots < r_k}}{av} \left( \sqrt{\frac{(X^i_{r_1} - X^j_{r_1})^2 + (X^i_{r_2} - X^j_{r_2})^2 + \ldots + (X^i_{r_k} - X^j_{r_k})^2}{k}} \right).$$

5. The method of claim 1, wherein at least one physical property of the component or of said several components of the electronic circuit or of the microelectromechanical system is modeled from the physical parameters by a modelization function in said processor, wherein said smallest average is decreased by a coefficient proportional to the maximum, for at least one of the plurality (n) of vectors, of reliability indexes, each reliability index being representative of the reliability of the modelization function for the at least one the plurality (n) of vectors.

6. The method of claim 1, wherein several physical properties of the component or of said several components of the electronic circuit or of the microelectromechanical system are measured, by said processor, for each value of said vectors, wherein the physical properties are capable of being modeled based on the physical parameters by several modelization functions, and wherein said smallest average is decreased by a coefficient proportional to the maximum, for at least one of the plurality (n) of vectors and for said modelization functions, of the minimum values, for the physical properties, of reliability indexes, each reliability index being representative of the reliability of one of the modelization functions for one of the physical properties and for one of at least one of the plurality (n) of vectors.

7. The method of claim 1, wherein with each parameter are associated a variation range and a probability distribution by said processor and wherein the step of determining the plurality (n) of vectors comprises the steps of:
  in said processor, determining initial plurality of vectors by random selections of the initial values of each physical parameter over the associated variation range by using the associated probability distribution; and in said processor repeating, until a stop condition is fulfilled, the steps of:

determining a candidate vector by random selections of a candidate value of each physical parameter over the associated variation range by using the associated probability distribution;

successively replacing with the candidate vector at least one vector from among the plurality (n) of vectors and determining, for each replacement, said corresponding smallest average;

if said smallest average which is maximum among the determined smallest averages is greater than said smallest average determined for the n vectors, replacing with the candidate vector the vector or one of the vectors for which said associated smallest average corresponds to said maximum smallest average when said vector is replaced with the candidate vector.

8. A computer-implemented method for determining a number n of first values of at least one physical property of one or several components of an electronic circuit or of a microelectromechanical system, comprising the steps of:

in a processor, determining, for each of at least p physical parameters of the component or of said several components of the electronic circuit or of the microelectromechanical system, n second values by determining a plurality (n) of vectors of dimension p, each component of each of the plurality of vectors corresponding to one of n initial values of one of said physical parameters;

iteratively modifying at least one of the plurality (n) of vectors to bring to a maximum, at least locally, for each pair of vectors from among pairs of said plurality (n) of vectors, the smallest average of the sum of distances between the vectors of said pair projected onto sub-spaces of dimension k, where k belongs to a set of integers ranging between 1 and p and at least comprising 1, 2, and p, the components of each of the plurality (n) of vectors corresponding, at the end of the iterations; and generating an output indicative of said experiment values of the physical parameters for said components; and in said processor, measuring, for each second value of the p physical parameters, the first corresponding value of the physical property.

9. The method of claim 8, wherein among the plurality (n) of vectors, at least n0 vectors are predetermined, n0 being an integer greater than or equal to one.

10. The method of claim 8, wherein the plurality (n) of vectors which bring to a maximum, at least locally, said smallest average, are determined according to a greedy algorithm.

11. The method of claim 8, wherein said smallest average is determined according to the following relation:

$$S(X^1, X^2, \ldots, X^n) = \min_{\substack{i \in \{1\ldots n\} \\ j \in \{n_0+1\ldots n\}}} d(X^i, X^j)$$

where:

X1, X2, ..., Xn are the n vectors;
i and j are integers;
n0 corresponds to a number, possibly zero, smaller than n, of predetermined vectors; and
d(Xi, Xj) is a distance defined by the following relation:

$$d(X^i, X^j) = \underset{k \in E}{av}(d_k(X^i, X^j))$$

where:

E is a set of integers ranging between 1 and p and comprising at least 1, 2, and p;
av is the average operator; and $$d_k(X^i, Y^j) = \underset{\substack{r_1, r_2, \ldots, r_k \in \{1 \ldots p\} \\ r_1 < r_2 < \ldots < r_k}}{av} \left( \sqrt{\frac{\left(X^i_{r_1} - X^j_{r_1}\right)^2 + \left(X^i_{r_2} - X^j_{r_2}\right)^2 + \ldots + \left(X^i_{r_k} - X^j_{r_k}\right)^2}{k}} \right).$$

12. The method of claim 8, wherein at least one physical property of the component or of said several components of the electronic circuit or of the microelectromechanical system is modeled from the physical parameters by a modelization function implemented by said processor, wherein said smallest average is decreased by a coefficient proportional to the maximum, for at least some of the n vectors, of reliability indexes, each reliability index being representative of the reliability of the modelization function for one of the at least some of the n vectors.

13. The method of claim 8, wherein several physical properties of the component or of said several components of the electronic circuit or of the microelectromechanical system are measured by said processor for each value of said vector, wherein the physical properties are capable of being modeled based on the physical parameters by several modelization functions, and wherein said smallest average is decreased by a coefficient proportional to the maximum, for at least one of the plurality (n) of vectors and for said modelization functions, of the minimum values, for the physical properties, of reliability indexes, each reliability index being representative of the reliability of one of the modelization functions for one of the physical properties and for one of at least one of the plurality (n) of vectors.

14. The method of claim 8, wherein with each parameter are associated a variation range and a probability distribution by said processor and wherein the step of determining the plurality (n) of vectors comprises the steps of:

determining initial vectors by random selections of the initial values of each physical parameter over the associated variation range by using the associated probability distribution; and repeating, until a stop condition is fulfilled, the steps of:

determining a candidate vector by random selections of a candidate value of each physical parameter over the associated variation range by using the associated probability distribution;

successively replacing with the candidate vector at least one vector from among the plurality (n) of vectors and determining, for each replacement, said corresponding smallest average;

if said smallest average which is maximum among the determined smallest averages is greater than said smallest average determined for the plurality (n) of vectors, replacing with the candidate vector the vector or one of the vectors for which said associated smallest average corresponds to said maximum smallest average when said vector is replaced with the candidate vector.

15. A system for determining for each of at least p physical parameters of one or several components of an electronic circuit or of a microelectromechanical system, a number n of experiment values, comprising:
   an entry interface capable of receiving number n; and
   a digital central processing unit capable of implementing the steps of:
      determining a plurality (n) of vectors of dimension p, each component of each of the plurality of vectors corresponding to one of n initial values of one of said physical parameters;
      iteratively modifying at least one of the plurality (n) of vectors to bring to a maximum, at least locally, for each pair of vectors from among pairs of said plurality (n) of vectors, the smallest average of the sum of distances between the vectors of said pair projected onto sub-spaces of dimension k, where k belongs to a set of integers ranging between 1 and p and at least comprising 1, 2, and p, the components of each of the plurality (n) of vectors corresponding, at the end of the iterations; and
      generating an output indicative of said experiment values of the physical parameters for said components.

16. A system for determining for each of at least p physical parameters of one or several components of an electronic circuit or of a microelectromechanical system, a number n of experiment values, comprising:
   an entry interface capable of receiving number n; and
   a digital central processing unit capable of implementing the steps of:
      determining, for each of at least p physical parameters of the component or of said several components of the electronic circuit or of the microelectromechanical system, n second values by
      determining a plurality (n) of vectors of dimension p, each component of each of the plurality of vectors corresponding to one of n initial values of one of said physical parameters;
      iteratively modifying at least one of the plurality (n) of vectors to bring to a maximum, at least locally, for each pair of vectors from among pairs of said plurality (n) of vectors, the smallest average of the sum of distances between the vectors of said pair projected onto sub-spaces of dimension k, where k belongs to a set of integers ranging between 1 and p and at least comprising 1, 2, and p, the components of each of the plurality (n) of vectors corresponding, at the end of the iterations; and
      generating, an output indicative of said experiment values of the physical parameters for said components; and
      measuring, for each second value of the p physical parameters, the first corresponding value of the physical property.

* * * * *